(12) United States Patent
Watanabe

(10) Patent No.: US 7,728,665 B2
(45) Date of Patent: Jun. 1, 2010

(54) DISTORTION COMPENSATION APPARATUS AND METHOD

(75) Inventor: Shin Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 13 days.

(21) Appl. No.: 12/342,394

(22) Filed: Dec. 23, 2008

(65) Prior Publication Data
US 2009/0289707 A1 Nov. 26, 2009

(30) Foreign Application Priority Data
May 22, 2008 (JP) .............................. 2008-134370

(51) Int. Cl.
H03F 1/26 (2006.01)
(52) U.S. Cl. ...................... 330/149; 375/297
(58) Field of Classification Search ................ 330/149, 330/129, 136; 375/297; 455/114.3
See application file for complete search history.

(56) References Cited

U.S. PATENT DOCUMENTS

| 6,856,196 | B2 * | 2/2005 | Okubo et al. | 330/136 |
| 7,113,037 | B2 * | 9/2006 | Nezami | 330/149 |
| 7,170,345 | B2 * | 1/2007 | Hongo | 330/149 |
| 2002/0027474 | A1 | 3/2002 | Bonds | |
| 2004/0232985 | A1 | 11/2004 | Itahara | |
| 2006/0067425 | A1 | 3/2006 | Windisch | |
| 2008/0036470 | A1 | 2/2008 | Kurosawa | |

FOREIGN PATENT DOCUMENTS

| EP | 1 492 228 | 12/2004 |
| GB | 2 282 291 | 3/1995 |
| JP | 2001-16283 | 1/2001 |
| JP | 2002-77284 | 3/2002 |
| JP | 2006-94486 | 4/2006 |

OTHER PUBLICATIONS

European Search Report dated Jun. 12, 2009, from the corresponding European Application.

* cited by examiner

Primary Examiner—Henry K Choe
(74) Attorney, Agent, or Firm—Katten Muchin Roseman LLP

(57) ABSTRACT

The distortion compensation apparatus includes: a branching unit to branch a part of the output signal of an amplifier to a signal path to a distortion compensating unit; a switch to pass the output signal of the amplifier to the interference or branching unit; and a controlling unit to control an amount of the compensation of the distortion under a pass-permitted state in which the switch passes the output signal in response to a result of measurement of a signal transmitted through the signal path under a state where the switch is in an interruption state.

9 Claims, 12 Drawing Sheets

US 7,728,665 B2

DISTORTION COMPENSATION APPARATUS AND METHOD

CROSS-REFERENCE TO RELATED APPLICATION(S)

This application is based upon and claims the benefit of priority of the prior Japanese Application No. 2008-134370 filed on May 22, 2008 in Japan, the entire contents of which are hereby incorporated by reference.

FIELD

The embodiment(s) discussed herein is directed to a distortion compensation apparatus and method. For example, the embodiment(s) may be employed for a transmission amplification unit of a radio apparatus.

BACKGROUND

In a transmission system of a radio apparatus, a digital pre-distortion (DPD) circuit can be used for compensating non-linear distortion of an amplifier. The DPD circuit compares the input and output signals of the amplifier, for example, thereby detecting a signal difference generated by distortion, and multiplies the input signal of the amplifier by a coefficient having characteristics that cancel the signal difference.

[Patent Document 1] Japanese Laid-open Patent Publication No. 2002-77284

[Patent Document 2] Japanese Laid-open Patent Publication No. 2001-16283

[Patent Document 3] Japanese Laid-open Patent Publication No. 2006-94486

For comparing the input and output signals of the amplifier, the DPD circuit branches a part of the output signal of the amplifier by use of a coupler or the like. Here, if an unnecessary high-frequency signal, which is radiated from other circuit parts to space, is coupled to the branched signal, it can occur that sufficient distortion compensation cannot be performed because of an error generated in detection of the signal difference. The previous techniques do not pay a consideration to the generation of an error caused by such coupling of the undesired wave.

SUMMARY

For example, exemplary embodiment(s) uses the following.

(1) According to an exemplary embodiment, there is provided an apparatus including a distortion compensation apparatus, including: a distortion compensating unit to perform compensation of distortion caused in an amplifier in accordance with a result of comparison between an input signal to the amplifier and an output signal from the amplifier; a branching unit to branch a part of the output signal to a signal path to the distortion compensating unit; a switch to interrupt or pass the output signal input to the branching unit; and a controlling unit to control an amount of the compensation of the distortion compensation under a pass-permitted state in which the switch passes the output signal in accordance with a result of measurement of a signal transmitted to the distortion compensating unit through the signal path under an interruption state in which the switch interrupts the output signal.

(2) According to an exemplary embodiment, there is provided a method including a distortion compensation method for use in an apparatus including: a distortion compensating unit to perform compensation of distortion caused in an amplifier in accordance with a result of comparison between an input signal to the amplifier and an output signal from the amplifier; and a branching unit to branch a part of the output signal to a signal path to the distortion compensating unit, the distortion compensation method including: measuring a signal transmitted to the distortion compensating unit through the signal path under an interruption state in which the output signal passes to the branching unit; and controlling an amount of the compensation of the distortion under a pass-permitted state in which the output signal is made to pass to the branching unit, in accordance with the result of the measurement.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

FIG. 6 is a vector diagram illustrating an example of a vector at the time of addition of an undesired wave under a state in which the switch exemplified in FIG. 1 is ON;

DESCRIPTION OF EMBODIMENT(S)

Hereinafter, exemplary embodiments will be described with reference to accompanying drawings. The following exemplary embodiments are merely examples and do not intend to exclude various modifications and variations to the proposed method and/or apparatus that are not specifically described herein. Rather, various modifications or variations may be made to the embodiments (for example, by combining the exemplary embodiments) without departing from the scope and spirit of the proposed method and/or apparatus.

[1] First Embodiment

Figure 1:
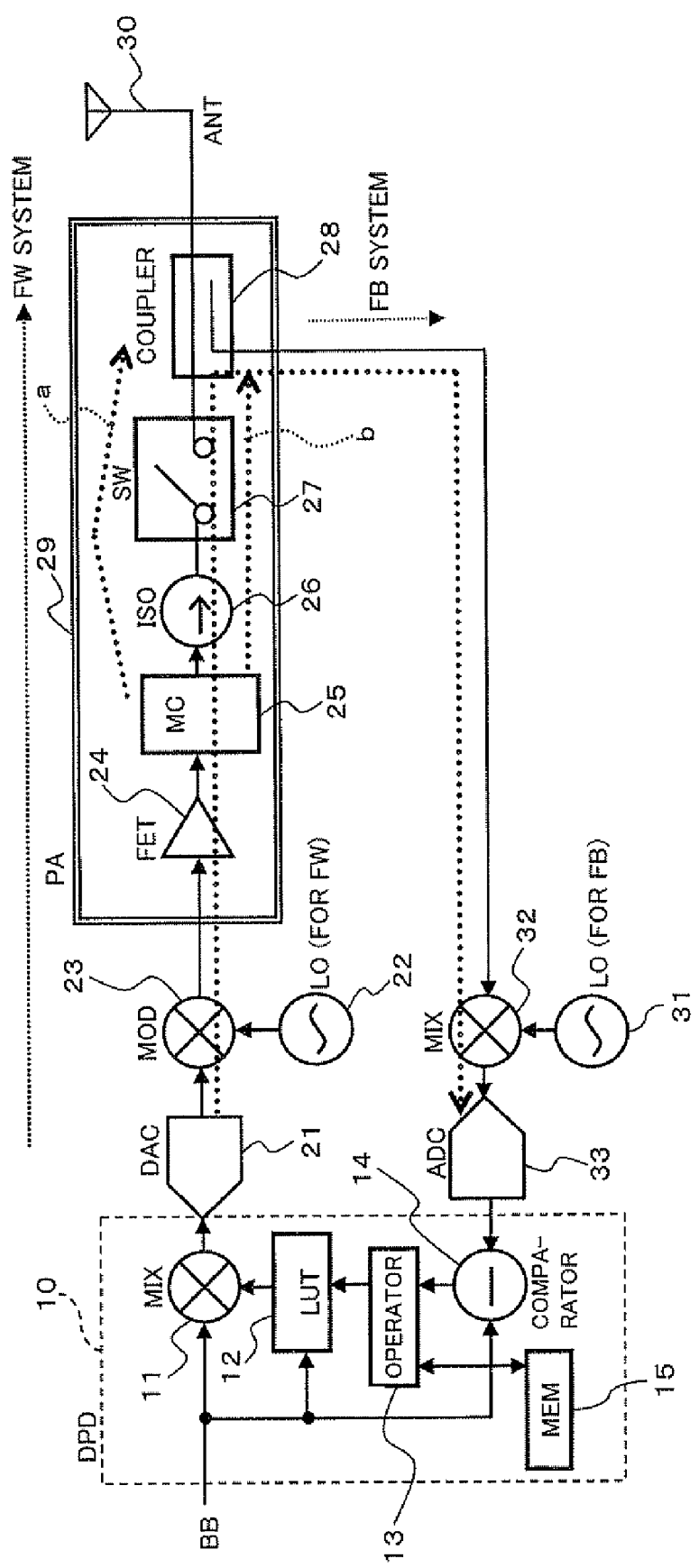
FIG. 1 is a block diagram illustrating a construction of a transmission unit of a radio apparatus having a DPD circuit according to one preferred embodiment.

FIG. 1 is a block diagram illustrating a construction of a transmission unit of a radio apparatus having a DPD circuit according to one preferred embodiment. The transmission unit illustrated in FIG. 1 can be used in the transmission unit at the radio terminal such as a transmission unit of a radio base station or a mobile telephone. As an example, the transmission unit includes: a mixer (multiplier) 11; a look-up table (LUT) 12; an operator 13; a comparator (subtractor) 14; and a memory (MEM) 15, as an example of the DPD circuit 10.

The transmission unit has a transmitter antenna (ANT) 30, and also includes: a digital-analogue converter (DAC) 21; a local oscillator (LO) 22; an orthogonal modulator (MOD) 23; and a high-power amplifier (PA) 29, which form an example of a forward (FW) system, which is a signal transmission path from the mixer 11 to the transmitter antenna 30. As an example, the high-power amplifier 29 further includes: a field-effect transistor (FET) 24 as an example of the amplifier (amplification element); a matching circuit (MC) 25; an isolator (ISO) 26; a radio frequency (RF, high-frequency) switch (SW) 27; and a coupler 28.

Further, as an example of the feedback (FB) system for forwarding a part of the transmission signals, being extracted by the coupler 28 and transmitted to the transmitter antenna 30, to the DPD circuit 10 (comparator 14), the transmission unit includes: a local oscillator (LO) 31; a mixer (multiplier) 32 as an example of a frequency converter (down-converter); and an analogue-digital converter (ADC) 33.

As an example, the elements except but the above FET 24 and the transmitter antenna 30 are used as an example of a distortion compensation apparatus which performs distortion compensation of the FET 24 based on the result obtained by comparing the input and output signals of the FET 24.

On the basis of the result of comparison between the input signal to the FET 24 and the output signal from the FET 24, the DPD circuit 10 performs compensation of distortion generated in the FET 24 to an input signal to the FET 24. In this DPD circuit 10, the mixer (distortion compensation unit) 11 multiplies a transmission baseband (BB) signal, which is an input signal, by a coefficient (distortion compensation coefficient) given by the LUT 12, thereby compensating distortion generated in the high-power amplifier 29 beforehand. In this instance, the above mentioned transmission BB signal is a digital complex signal formed by, for example, an I signal and a Q signal.

The DAC 21 converts the transmission BB signal (digital signal) subjected to distortion compensation in the mixer 11 into an analogue signal. The thus obtained analogue signal is input to the orthogonal modulator 23.

The orthogonal modulator 23 performs mixing of a frequency signal given by the local oscillator 22 with the analogue signal input from the local DAC 21, thereby executing orthogonal modulation and frequency conversion (up-conversion) to a radio frequency (RF). The thus obtained RF transmission analogue modulation signal is input to the high-power amplifier 29 (FFT 24).

The high-power amplifier 29 uses the FET 24 to amplify the transmission analogue modulation signal so as to have a predetermined transmission power. The signal thus amplified by the FET 24 is input to the MC 25.

The MC 25 is a circuit for realizing impedance matching in the signal path from the FET 24 to the transmitter antenna 30, and it is, for example, a distribution constant circuit. The distribution constant circuit has a property such that a part of an RF signal is apt to be radiated to space since the distribution constant circuit takes a conductive pattern when a high-frequency RF signal is transmitted. Thus, in the MC 25 positioned at the output unit of the FET 24, the high-frequency (RF) signal level radiated to space is apt to become large in comparison with those positioned at other positions.

The isolator 26 prevents the high-frequency signal amplified by the FET 24 from being reflected at the radio frequency switch 27 and being propagated to the FET 24 side, in order to stabilize output impedance of the output unit of the FET 24. With the presence of this isolator 26 between the MC 25 and the SW 27, even if the high-frequency signal, amplified by the FET 24, is reflected by the SW 27 under a state where the SW 27 is OFF (open), the amplified high-frequency signal is terminated with terminal resistance of the isolator 26, thereby being attenuated sufficiently.

Therefore, even in a case where the RF switch 27 is in a state of OFF, the output impedance viewed from the FET 24 is kept to be characteristic impedance. That is, even if the RF switch 27 is OFF, the FET 24 performs an amplification operation under a condition equal to that at the time the RF switch 27 is ON (close). Hence, radiation of an undesired wave from the MC 25 occurs equally to the time at which the RF switch 27 is in a state of ON.

In this instance, for stabilizing the output impedance of the output unit of the FET 24, it is possible to apply a circulator and a terminal resistance in combination in place of the isolator 26 (the same goes for in the following descriptions).

The RF switch 27 passes the signal input from the isolator 26 to the coupler 28 under a state of ON, and interferes the signal under a state of OFF. As described later, this RF switch 27 is controlled to be in a state of OFF at a training stage of distortion compensation, and is controlled to be in a state of ON in a case where a distortion compensation operation is normally performed. The switch control unit that performs the above control is omitted from illustration thereof in FIG. 1.

The coupler 28, which is an example of a directive coupler (branching unit), branches a part of the signals that have passed through the RF switch 27 to the FB signal path to the DPD circuit 10. The branched signal is then fedback to the mixer 32. The remaining signal, which has not branched, is sent from the transmitter antenna 30 toward other radio devices (for example, a radio base station, or the like).

The mixer 32 multiplies the feedback (FB) signal input from the coupler 28 by the frequency signal given by the local oscillator 31, thereby demodulating the FB signal (orthogonal detection). The thus obtained demodulation signal (complex signal) is input to the ADC 33.

The ADC 33 converts the demodulation signal from the mixer 32 into a digital signal and then inputs the digital signal to the comparator 14 of the DPD circuit 10.

The comparator 14 compares the signal input from the ADC 33 with the transmission BB signal input to the mixer 11, taking the transmission BB signal as a reference signal, and detects a signal difference. The thus obtained signal difference is then input to the operator 13. In this instance, a delay circuit for making the timings of both of the signals, which are subjects of comparison by the comparator 14, coincident with each other can be provided for the FB system.

The operator 13 uses a predetermined algorithm, such as the least mean square (LMS) algorithm, in such a manner that a signal difference obtained by the comparator 14 becomes minimal, to update a distortion compensation coefficient in the LUT 12.

The memory (error signal storage) 15 stores therein such information as error vector obtained by the operator 13 at the training stage of the distortion compensation, which will be described later. The error vector is generated mainly resulting from, for example, an undesired wave radiated from the MC 25 to space being combined with, for example, the signal fedback from the coupler 28 to the mixer 32. The operator 13 corrects the distortion compensation coefficient in the LUT 12 based on the information stored in the memory 15 at the time of a distortion compensation operation performed after completion of the training.

The LUT (distortion compensation coefficient holding unit) 12 holds therein the distortion compensation coefficient given to the mixer 11. In such holding of the distortion compensation coefficient, it is possible, for example, to make the power value of the input signal (transmission BB signal) to the mixer 11 to be an index address. Thus, the distortion compensation coefficient of the index address corresponding to the power value of the transmission BB is given to the mixer 11.

Here, the LUT 12, the operator 13, the comparator 14, and the memory 15 are used as an example of a control unit for controlling the distortion compensation amount under a state in which the RF switch 27 is in a state of ON based on the measurement result (training result) of the FB signal transmitted to the DPD circuit 10 through the FB signal path under a state in which the RF switch 27 is in a state of OFF.

The transmission unit with the above described DPD circuit 10 branches a part of the output signal of the high-power amplifier 29 (FET 24) by the coupler 28 and feedbacks the part of the output signal to the DPD circuit 10 (comparator 14). The comparator 14 compares the FB signal with the input signal to the high-power amplifier 29, thereby detecting a difference between the signals. Then, distortion generated in the high-power amplifier 29 is compensated beforehand by means of giving the distortion compensation coefficient in the LUT 12 that minimizes the detected signal difference to the mixer 11 (the input signal to the FET 24).

Here, the coupler 28 which branches a part of the main signal in the FW system transmitted from the DAC 21 to the transmitter antenna 30 can be provided in the cabinet of the high-power amplifier 29 as exemplified in FIG. 1, for the purpose of efficiently arranging each of the components in the radio apparatus.

In this case, if the signal radiated from the MC 25 is coupled to the FB output port of the coupler 28 and/or the FB signal path through which the signal branched by the coupler 28 is transmitted, a state is caused in which the space radiated signal is added to the FB signal. This causes a state in which the signal output to the transmitter antenna 30 through the main signal path of the FW system differs from the FB signal which is fedback to the FB signal path.

That is, in a case where the signal (undesired wave) radiated from the MC 25 to space is coupled to the coupler 28 and/or the FB signal path, the amplitude of the undesired wave is attenuated after the coupling. However, once the signal is radiated to space, the signal is coupled to the FB signal path through a path different from the FB signal path. Because of this, the FW signal path does not always agree with the FB signal path in amplitude, phase, or delay amount (time), of the signal passing therethrough.

If distortion compensation is performed under this state based on the FB signal, the DPD circuit 10 performs distortion compensation to the signal of the FB signal path, not to the signal of the FW signal path sent from the transmitter antenna 30. Therefore, although it is possible to compensate distortion of the FB signal, it can occur that distortion compensation ability is deteriorated since a radiated signal added to the signal input to the transmitter antenna 30 becomes an error.

For example, the DPD circuit 10 determines a distortion compensation coefficient given from the LUT 12 to the mixer 11 in such a manner that the distortion component becomes minimal, with reference to the FB signal. At that time, when compensations of 20 dB through 30 dB are performed at an adjacent channel leakage ratio (ACLR) as a distortion compensation amount, the space radiated signal which couples to the FB signal path becomes an error signal for a distortion compensation operation. Thus, there is a possibility that the distortion compensation amount is deteriorated by about 1 dB through 3 dB.

Therefore, to prevent the signal radiated from the MC 25 to space from coupling to the FB signal path, measures including the coupler 28 are taken to prevent the space radiation signal (undesired wave) from coupling to the FB signal path, for the purpose of preventing the signal radiated from the MC 25 to space from coupling to the FB signal path. For example, the following measures can be considerable: isolating the MC 25 from the coupler 28 with a metal wall in the cabinet; implementing shielding processing such as covering the MC 25 and the coupler 28 with a metal cover.

However, the shielding processing can cause such problems as enlarging of the cabinet size of the high-power amplifier 29 and increase in cost because of the complicated construction.

Thus, according to the present embodiment, the RF switch 27 is proved between the isolator 26 and the coupler 28, as described above. In the training stage of distortion compensation, the signal component (amplitude, phase, delay time, or the like) of the undesired wave coupled to the FB signal path is measured under a state in which the RF switch 27 is in a state of OFF, an error vector being thereby obtained.

As already described, even when the RF switch 27 is made to be in a state of OFF, the FET 24 performs an amplification operation under the condition equivalent to that at the time the RF switch 27 is in a state of ON, and an undesired wave is also radiated from the MC 25. Accordingly, it is possible to monitor a signal (undesired wave) coupled to the FB signal path by means of measuring the signal feedback to the DPD circuit 10 under a state in which the RF switch 27 is in a state of OFF.

Then, at the time a normal distortion compensation operation is performed after completion of the training, the RF switch 27 is made to be in a state of ON, and a distortion compensation ability is improved by means of reflecting the measured error vector to updating processing of the LUT 12.

Hereinafter, a description will be made of an example of a detailed operation with reference to FIG. 2 through FIG. 7 in combination.

First of all, according to the present example, the training is performed as the two divided stages before a distortion compensation operation.

In the first stage, the RF switch 27 is made to be in a state of ON, and the ADC 33 samples the FB signal from the mixer 32, and the operator 13 measures the amplitude, phase, delay time, or the like, of the FB signal. This training corrects the dispersion of the amplitude, phase, delay time, or the like, generated in the analogue unit, and determines the reference of the distortion compensation coefficient.

Figure 2:
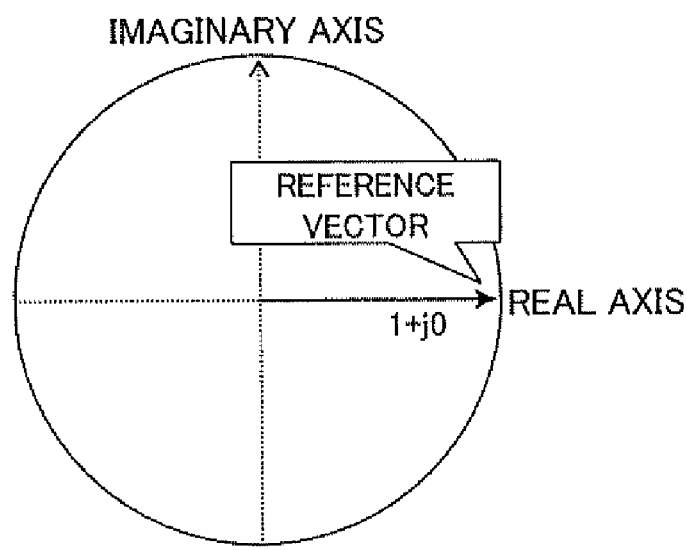
FIG. 2 is a vector diagram illustrating an example of a reference vector of an LUT coefficient exemplified in FIG. 1.

At that time, if taking a transmission BB signal as the reference signal in the operator 13, the distortion compensation coefficient of the LUT 12 after the FB signal is measured and error correction is performed, becomes such as is illustrated in, for example, FIG. 2, and (1+j0) becomes the reference vector. The reference vector is the reference vector under a state where an undesired wave is coupled to the FB signal.

Figure 7:
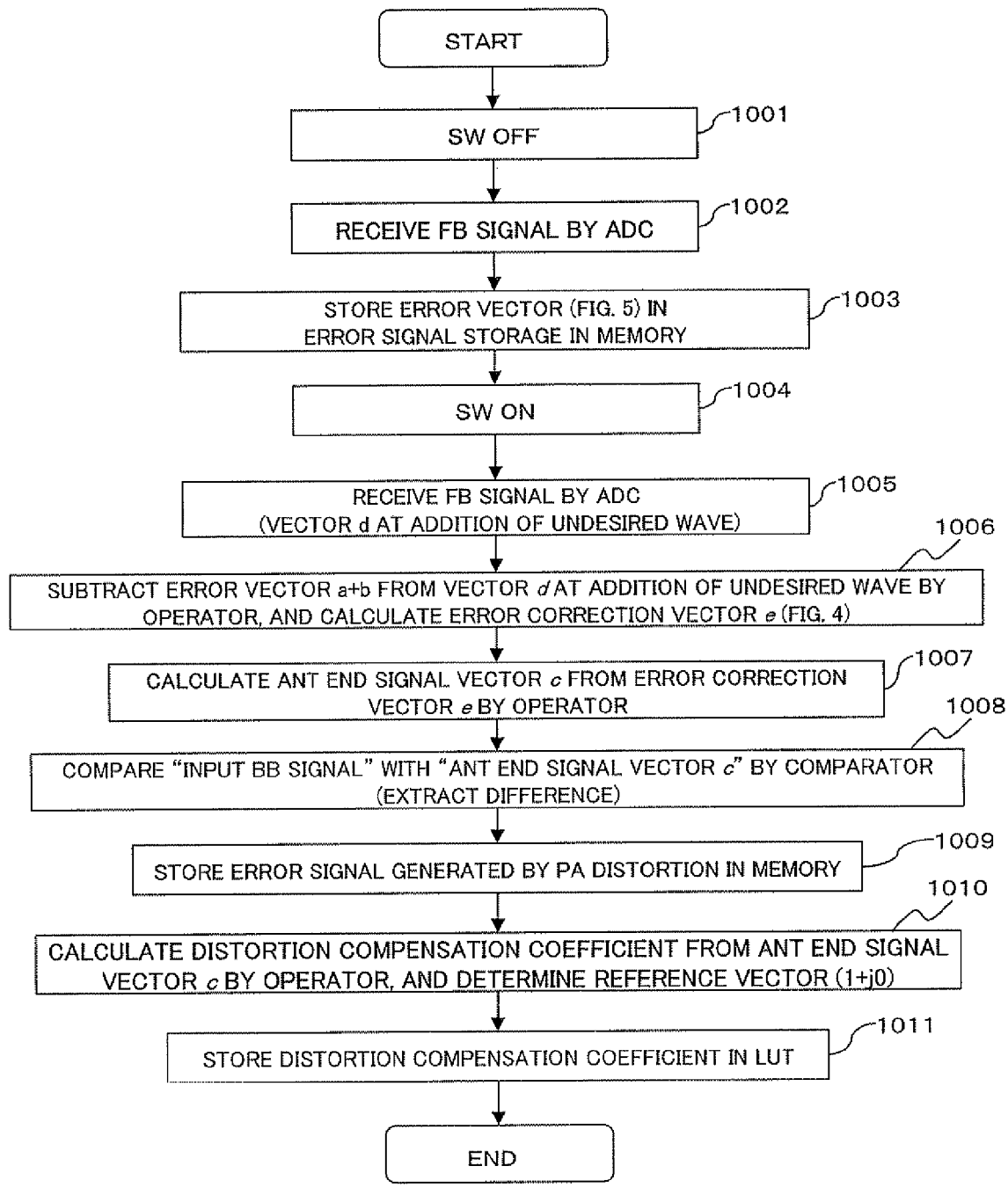
FIG. 7 is a flowchart for describing a distortion compensation operation performed by the transmission unit exemplified in FIG. 1.

In the second stage, the RF switch 27 is made to be in a state of OFF (processing 1001 in FIG. 7). Under this state, the ADC 33 samples the signal input from the mixer 32 (processing 1002 in FIG. 7), and the operator 13 measures the amplitude, phase, delay time, or the like, of the signal. That is, the operator 13 measures the amplitude, phase, delay amount, or the like, of the signal (undesired wave) coupled to the FB signal from a path other than the FW signal path.

In FIG. 1, the dotted arrow a indicates how the high-frequency signal radiated from the MC 25 is coupled to the coupler 28. Further, the dotted arrow b indicates how the high-frequency radiated from the MC 25 is coupled to the FB signal path, which is the output path of the coupler 28. Taking these as the main elements of the undesired wave, the amplitude, phase, delay amount, or the like, are measured.

Figure 3:
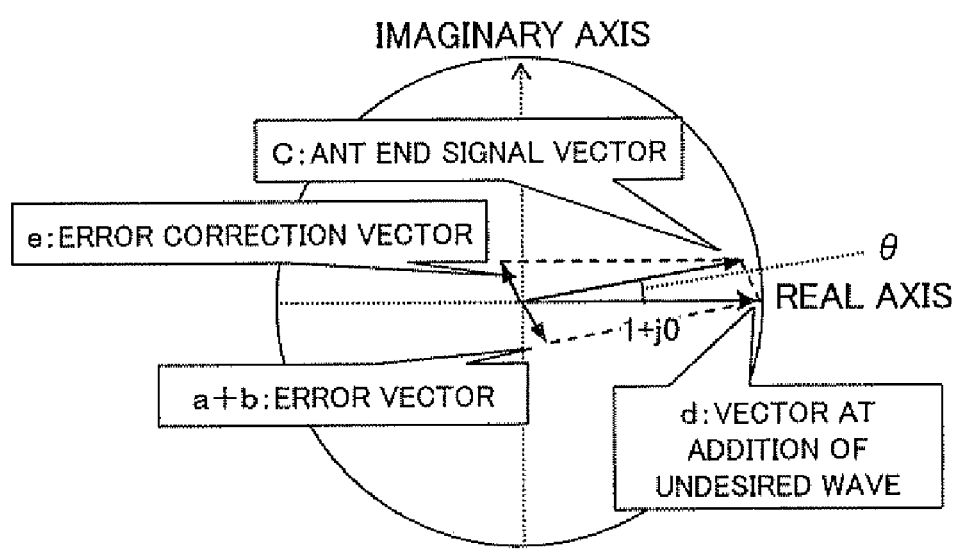
FIG. 3 is a vector diagram illustrating an example of a signal vector in a case where an undesired wave is coupled to the FB signal path exemplified in FIG. 1.

Here, supposing that the RF switch 27 is in a state of ON, as exemplified in FIG. 3, the signal (undesired wave) (a+b: error vector) of a path other than the FW signal path is added to the signal (c: ANT end signal vector) of the input unit of the transmitter antenna 30 (the output unit of the coupler 28). As a result, the signal vector with the both signal vectors added thereto becomes the vector at the time of addition of an undesired wave indicated by the reference character d in FIG. 3.

Accordingly, the vector in the inverse direction as large as the error vector (a+b) becomes the error correction vector (see reference character e in FIG. 3) which cancels the error vector, and it becomes possible to restore the correct ANT end signal vector obtained by removing an undesired wave coupled thereto by means of adding this error correction vector e to the reference vector 1+j0.

The DPD circuit 10 originally has a purpose of performing distortion compensation with the signal at the input unit of the transmitter antenna 30 as the reference, and takes 1+j0 as the reference vector with the transmission BB signal, which is a reference signal. Thus, the amplitude and phase should be adjusted in such a manner that the ANT end signal vector c depicted in FIG. 3 agrees with the reference vector 1+j0.

Figure 4:
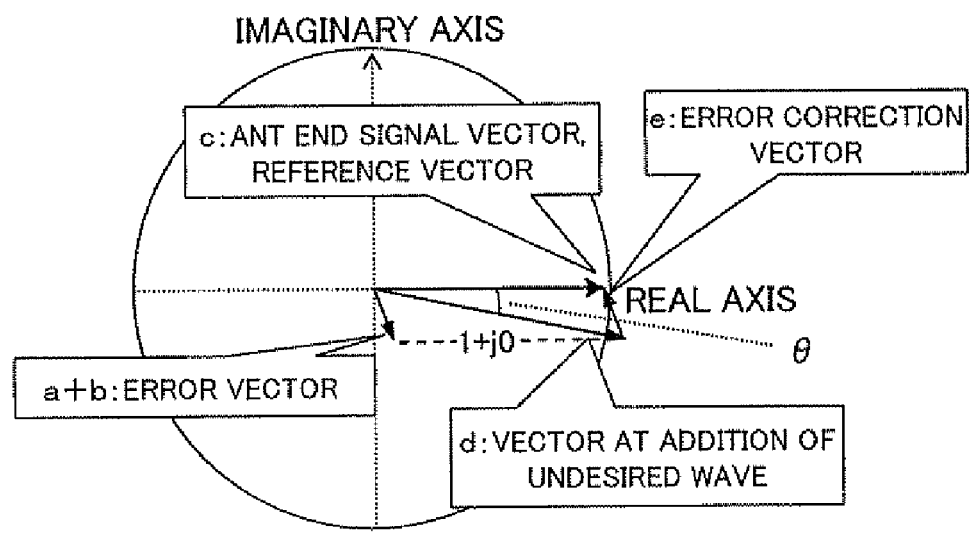
FIG. 4 is a vector diagram illustrating an example of a signal vector in a case where the switch exemplified in FIG. 1 is OFF.

FIG. 4 illustrates an example of a result obtained by making the ANT end signal vector c agree with the reference vector 1+j0. This FIG. 4 illustrates an example where each vector exemplified in FIG. 3 is rotated clockwise by θ [deg], and where changes are made in such a manner that the amplitude ratio of a vector is kept in such a manner that the ANT end signal vector c agrees with the reference vector 1+j0.

Figure 5:
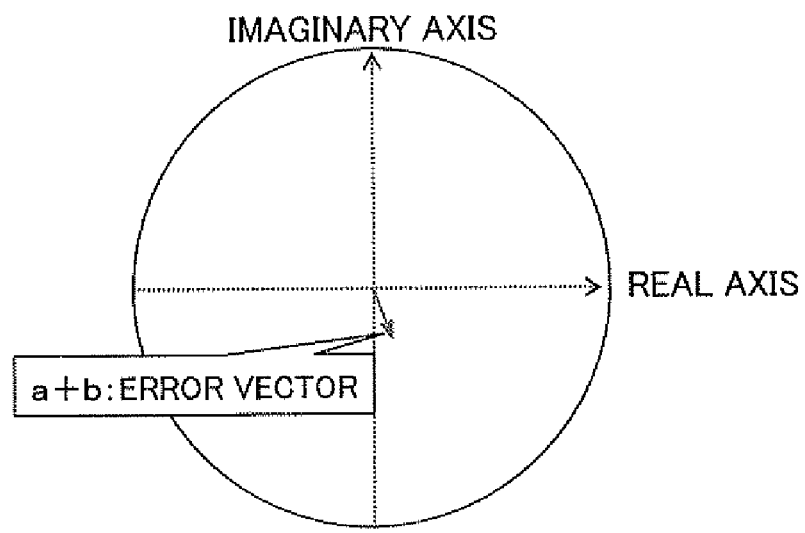
FIG. 5 is a vector diagram illustrating an example of an error vector due to an undesired wave measured under a state in which the switch exemplified in FIG. 1 is OFF.

Accordingly, in the second stage of the training, the operator 13 measures the amplitude, phase, and delay amount of the undesired wave coupled to the FB path under the state where the RF switch 27 is in a state of OFF, thereby obtaining the signal vector (error vector) exemplified in FIG. 5. The thus obtained error vector is stored in the memory 15 (processing 1003 in FIG. 7).

When a normal distortion compensation operation is performed after completion of the second stage of the above training, the RF switch 27 is made to be in a state of ON (processing 1004 in FIG. 7). In this case, the DPD circuit 10 (operator 13) is added thereto with the FB signal (the vector at the time of addition of an undesired wave in FIG. 6) coupled with the unnecessary wave, and the ADC 33 converts the FB signal into a digital signal, and the thus obtained digital signal is then input to the DPD circuit 10 (processing 1005 in FIG. 7).

The operator 13 subtracts the error vector stored in the memory 15 from the vector with an undesired wave added thereto, thereby obtaining an error correction vector e (see FIG. 4) (processing 1006 in FIG. 7). The operator 13 then corrects the vector d with an undesired wave added thereto (see FIG. 4) based on the thus obtained error correction vector e, thereby obtaining an ANT end signal vector c (processing 1007 in FIG. 7).

On the other hand, the comparator 14 compares a reference signal (transmission BB signal) with the ANT end signal vector c to obtain a difference signal (processing 1008 in FIG. 7). This difference signal is held in the memory 15 as an error signal generated as a result of amplification distortion caused by the high-power amplifier 29 (FFT 24) (processing 1009 in FIG. 7).

Then, the operator 13 determines a distortion compensation coefficient in such a manner that the above obtained ANT end signal vector agrees with the reference vector 1+j0 (processing 1010 in FIG. 7), and stores (reflects) the thus determined distortion compensation coefficient in the LUT 12 (processing 1011 in FIG. 7).

As described above, according to the present example, even when an undesired wave is coupled to the FB signal path, it is still possible to perform appropriate distortion compensation to the ANT end signal, so that the deterioration of the ability of distortion compensation to the ANT end signal is capable of being prevented.

Accordingly, even in a case where the coupler 28 is provided in the high-power amplifier 29, it is unnecessary to provide a shielding component for shielding the coupler 28 and the FB signal path in order to avoiding coupling of an undesired wave (crosstalk). As a result, even when an RF switch 27 is added in the high-power amplifier 29, it is still possible to down-size the high-power amplifier 29, which contributes to down-sizing of a radio apparatus.

For example, in such compact radio apparatuses as mobile telephones, even if an undesired wave is coupled to the FB signal path in an extremely high-density circuit when the DPD circuit 10 is installed, it is still possible to correct an error vector generated by the undesired wave due to the above described training, so that the distortion compensation ability is capable of being improved.

In a case of a motile telephone, since the down-sizing of the apparatus is required, it is difficult to provide a shielding construction for protecting the coupler 28 and the FB signal path from coupling of an undesired wave thereto. Therefore, as described above, it is significantly useful that an error of the undesired wave coupled to the FB signal is corrected by addition of the RF switch 27 as described above.

Further, since improvement of the distortion compensation ability also improve the amplification efficiency of the high-power amplifier 29, it is possible to reduce power consumption of the mobile telephone. As a result, it is also possible to reduce the battery consumption amount of the mobile telephone, so that the mobile telephone is capable of being used for a longer time.

[2] Second Embodiment

At the time the second stage of the above training is performed, the RF switch 27 is made into a state of OFF. In that case, the signal level of an undesired wave to be coupled to the coupler 28 and the FB signal path is lower than the signal level transmitted through the FW signal path. Because of this, it is considerable that a case occurs in which accurate measurement of an undesired wave is unavailable because of the effects from thermal noise or the like.

Figure 8:
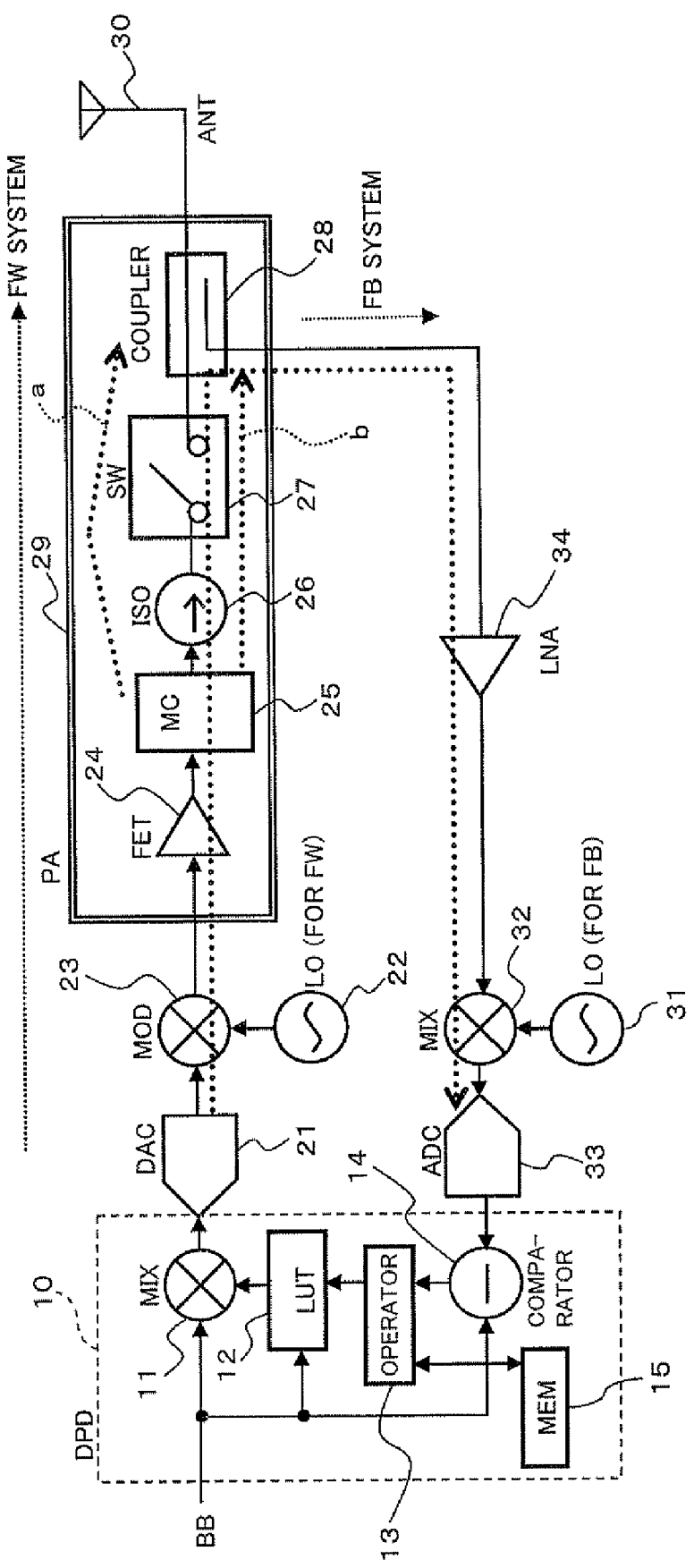
FIG. 8 is a block diagram illustrating a second embodiment of the transmission unit exemplified in FIG. 1.

Hence, as illustrated in FIG. 8, for example, there provided is a low-noise amplifier (LNA) 34 for the FB signal path from the coupler 28 to the mixer 32. The LNA 34 amplifies the FB signal branched by the coupler 28 up to a predetermined signal level with low noise (for example, a signal of the similar degree to the signal level transmitted through the FB signal path in a case where the RF switch 27 is made in a state of ON), and then inputs the amplified signal to the mixer 32. With this arrangement, it is possible to suppress the effects of thermo noise down to be minimal, so that the accuracy of measurement of the undesired wave (error vector) at the time of training is capable of being improved.

In this instance, in FIG. 8, the elements added thereto with the reference characters the same as those already described are the elements similar to or the same as those already described.

[3] Third Embodiment

Figure 9:
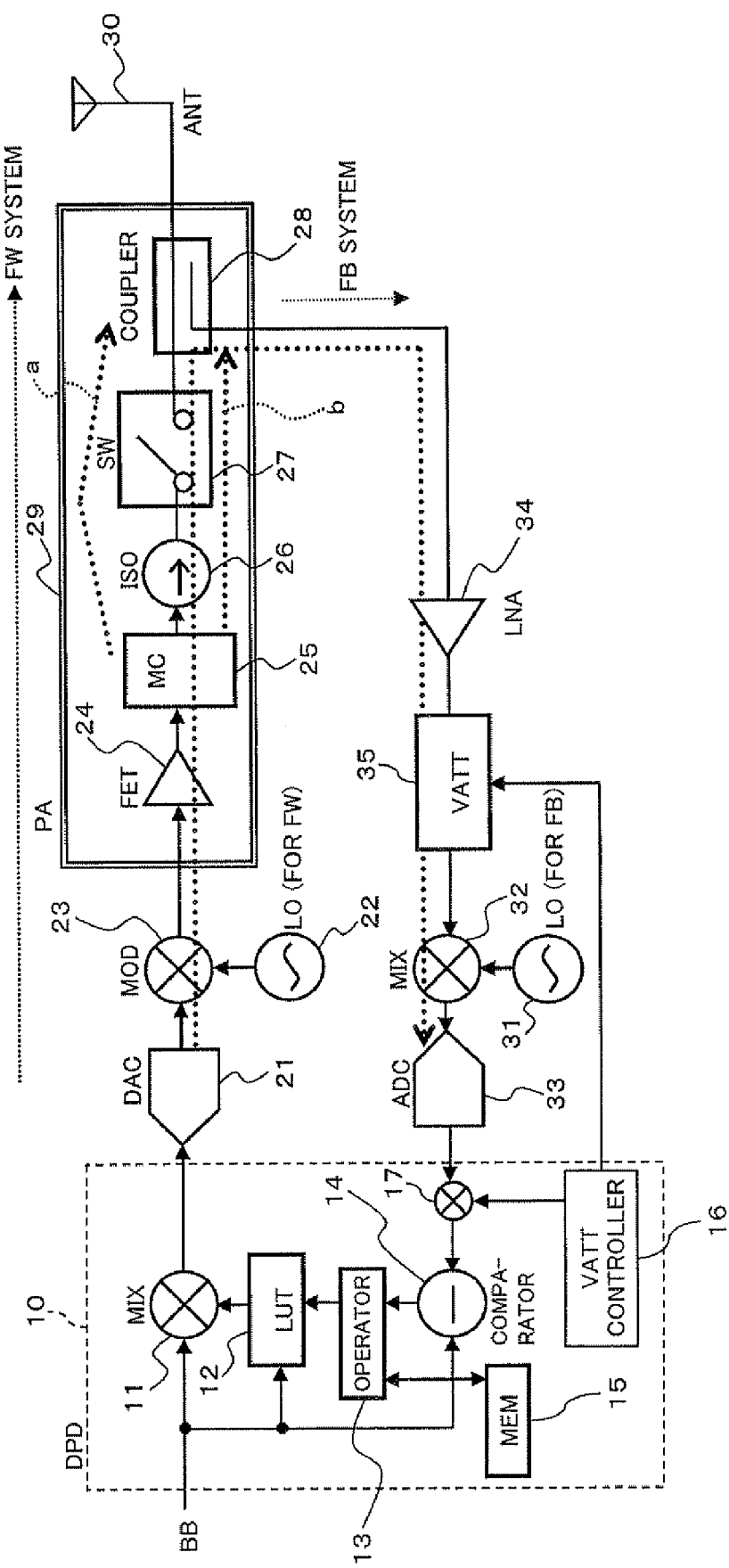
FIG. 9 is a block diagram illustrating a third embodiment of the transmission unit exemplified in FIG. 1.

FIG. 9 is a block diagram illustrating a construction of the transmission unit of a radio apparatus having a DPD circuit according to a third embodiment of the one preferred embodiment. In comparison with the construction exemplified in FIG. 1, the transmission unit illustrated in FIG. 9 differs from that of FIG. 1 in that the transmission unit illustrated in FIG. 9 includes: an LNA 34 already described in the second embodiment; and a variable attenuator (VATT) 35 provided between the LNA 34 and the mixer 32 on the FB signal path. Further, the DPD circuit 10 is provided with a VATT control unit 16 and a multiplier 17 provided between the comparator 14 and the ADC 33. In this instance, in this FIG. 9, the elements added thereto with reference characters the same as those already described are the elements similar to or the same as those already described unless otherwise described.

The variable attenuator (variable attenuating unit) 35 is operable to attenuate the level of the FB signal, which is an output signal of the LNA 34. The amount of such attenuation is controlled by the VATT control unit 16. The control of this attenuation amount can be performed in connection with the state of ON/OFF of the RF switch 27. For example, at the time the RF switch 27 is in a state of ON, the attenuation amount is increased to lower the input signal level to the ADC 33; at the time the RF switch 27 is in a state of OFF, the attenuation amount is decreased to increase the input signal level to the ADC 33.

The signal level of the undesired wave coupled to the FB signal due to space radiation is lower than the FB signal level at the time the RF switch 27 is in a state of ON. Hence, if a low-level signal is input to the ADC 33, it is apt to be effected by the noise floor of the ADC 33. Therefore, in the present example, the attenuation amount of the variable attenuator 35 is reduced at the second stage (measuring of the undesired wave) of the training, the input signal level to the ADC 33 being thereby increased.

For example, it is assumed that the level ratio between the main signal branched by the coupler 28 and the undesired wave coupled to the main signal due to space radiation is 30 [dB], the VATT control unit 16 makes the attenuation amount of the variable attenuator 35 to be 30 [dB] at the time the RF switch 27 is in a state of ON, while it makes the attenuation amount to be 0 [dB] at the time the undesired wave level measurement is performed under a state in which the RF switch 27 is in a state of OFF.

This makes it possible to make the input signal level to the ADC 33 constant regardless of the state of ON/OFF of the RF switch 27. That is, at the time the RF switch 27 is in a state of OFF, the attenuation amount of the variable attenuator 35 is reduced, thereby increasing the input signal level to the ADC 33. As a result, it is possible to make the ADC 33 less prone to being effected by the noise floor of the ADC 33. Therefore, at the time of measuring the undesired level, it is possible to suppress generation of an error caused by the noise floor when the ADC 33 converts the analogue signal into a digital signal.

Here, in a case where the attenuation amount of the variable attenuator 35 is made to be variable, since an error due to individual dispersion of the variable attenuator 35 is generated in the FB signal, it is preferable that error correction be performed based on the logical values relating to each of the amplitude, the phase amount, and the delay amount in a case where the attenuation amount of the variable attenuator 35 is varied.

For example, it is assumed that a difference of the change amounts of the attenuation amount is given such that the amplitude is 30.2 [dB], the phase is 0.5 [deg], the delay amount is 0.1 [nsec] in contrast to example of logical values such that the amplitude difference is 30.0 [dB], the phase difference is 0 [deg], the delay amount difference is 0 [nsec]. In this case, since the amplitude error is 0.2 [dB], the phase error is 0.5 [deg], the delay error is 0.1 [nsec] in contrast to the logical values, the DPD circuit 10 is operated with correction of these errors at the time of a distortion compensation operation performed.

The difference measurement of the above change amount is made to be available by means of, for example, making the attenuation amount of the variable attenuator 35 varied to 0 [dB] and 30 [dB] under a state in which the RF switch 27 is in a state of ON, and by means of measuring the amplitude, the phase, the delay amount, respectively, before and after the changing is performed.

The multiplier 17 multiplies the output signal of the ADC 33 by a coefficient in accordance with the attenuation amount by the variable attenuator 35, thereby realizing a function of adjusting the input signal level to the comparator 14 to the signal level before being subjected to the level change performed by the variable attenuator 35. The above described coefficient is given by, for example, the VATT control unit 16. As an example, in a case where the attenuation amount of the variable attenuator 35 is 30 [dB], the VATT control unit 16 gives the multiplier 17 the above mentioned coefficient which increases the output signal level of the ADC 33 1000 times (an increase of 30 dB).

The above described transmission unit in the present example increases/decreases the attenuation amount of the variable attenuator 35 in connection with the state of the RF switch 27 being ON/OFF, thereby changing the input signal level to the ADC 33 to measure the level variable error due to the variable attenuator 35 beforehand. Further, under the state of the RF switch 27 being OFF, the transmission unit measures an error signal generated by the undesired wave coupled to the FB signal. Under a normal distortion compensation operation, the transmission unit corrects an error signal resulting from the above undesired wave and the level variable error due to the variable attenuator 35, thereby performing distortion compensation.

A description will be made hereinafter of an example of a detailed operation with reference to FIG. 10 and FIG. 11 in combination.

Figure 10:
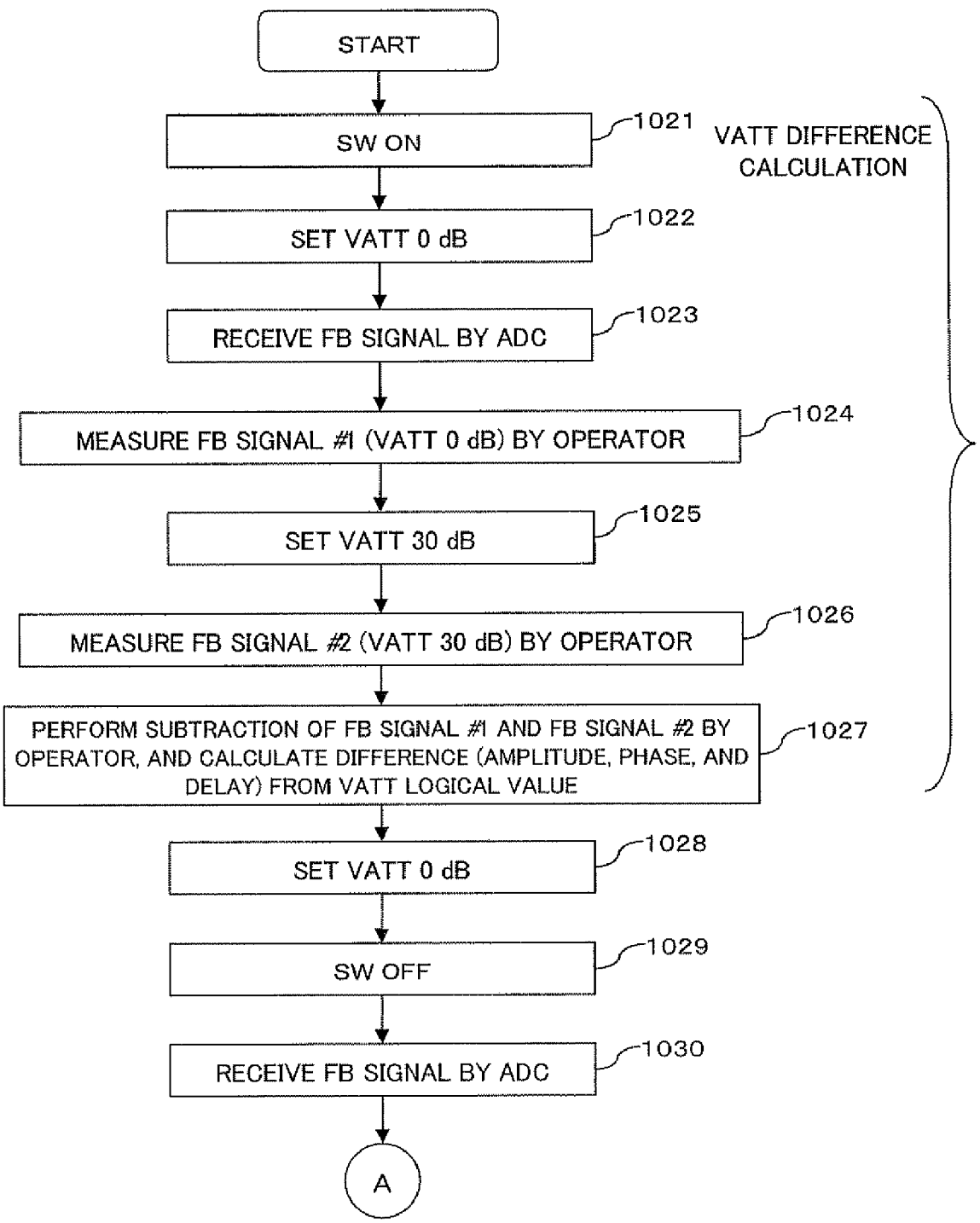
FIG. 10 is a flowchart for describing a distortion compensation operation performed by the transmission unit exemplified in FIG. 9.
Figure 11:
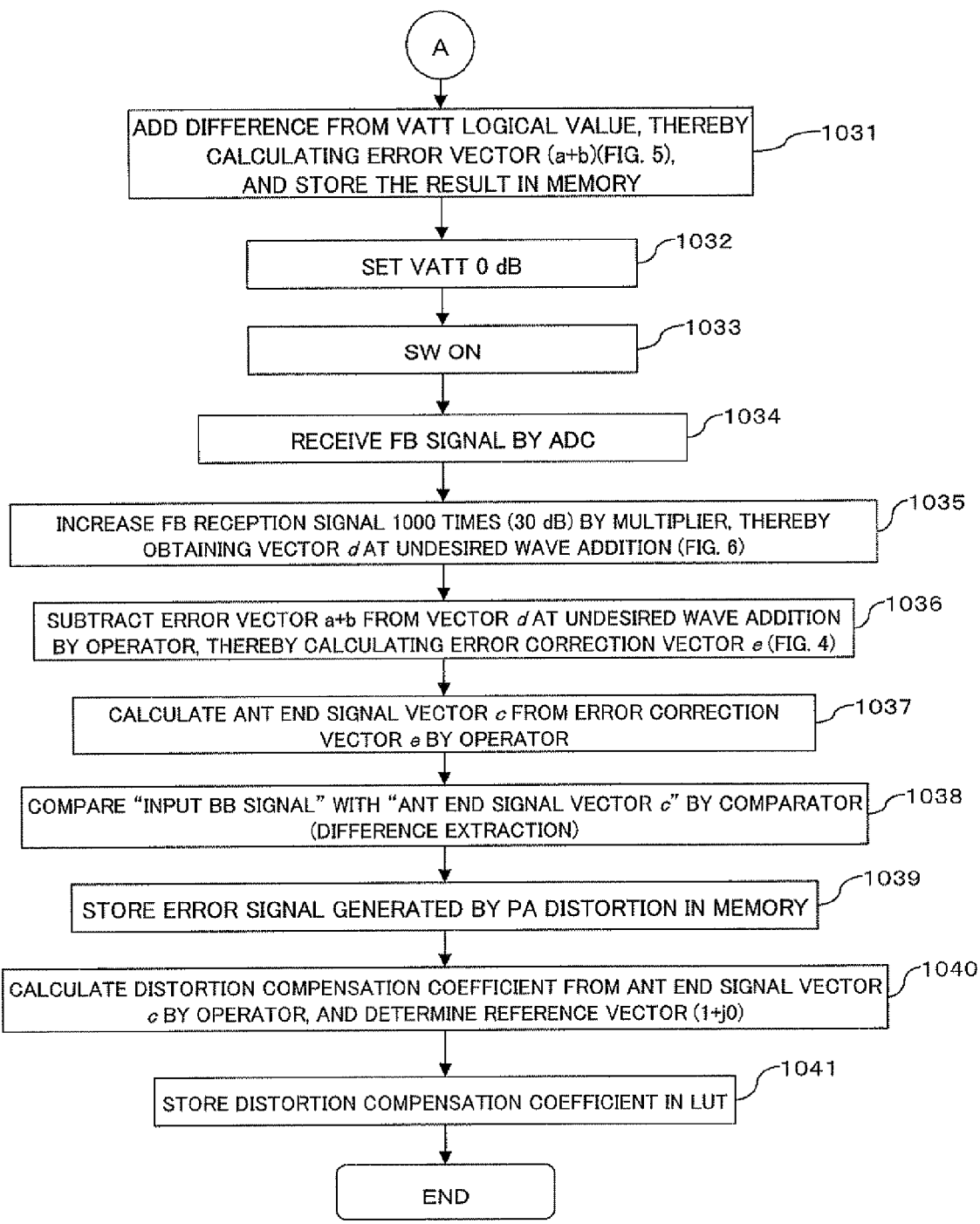
FIG. 11 is a flowchart for describing a distortion compensation operation performed by the transmission unit exemplified in FIG. 9.

First of all, as exemplified in FIG. 10, to correct (calibrate) an error due to individual dispersion of the variable attenuator 35, the RF switch 27 is made to be in a state of ON (processing 1021 in FIG. 10). Further, the VATT control unit 16 sets the attenuation amount of the variable attenuator 35 to 0 [dB] (processing 1022). In this instance, although it is not impossible to perform the above mentioned calibration in a state where the RF switch 27 is made to be in a state of OFF, it is preferable that the calibration be performed under a state where the RF switch 27 is made to be in a state of ON (the same goes for the following description).

Under this state, the operator 13 receives an FB signal #1, which is an output signal of the mixer 32, which output signal is a digital signal obtained by conversion performed by the ADC 33, by way of the comparator 14 (processing 1023). The operator 13 measures the amplitude, the phase, and the delay amount, of the FB signal #1 (processing 1024).

Subsequently, the VATT control unit 16 sets the attenuation amount of the variable attenuator 35 to 30 [dB] (processing 1025 in FIG. 10), and measures the amplitude, the phase, and the delay amount, of the FB signal input from the comparator 14 by way of the ADC 33 under that state (processing 1026).

The operator 13 obtains the differences of the amplitude, the phase, and the delay amount, between the measured FB signal #1 and FB signal #2, and then obtains the differences thereof from the logical values of the above mentioned differences (processing 1027). The thus obtained difference is stored, for example, in the memory 15.

Subsequently, in order to perform measurement (training) of the undesired wave coupled to the FB signal path, the VATT control unit 16 sets the attenuation amount of the variable attenuator 35 to 0 [dB] (processing 1028). Further, the RF switch 27 is made to be in a state of OFF (processing 1029).

Under this state, the operator 13 measures the amplitude, phase, and delay amount of the FB signal (undesired wave) input from the comparator 14 by way of the ADC 33 (processing 1030). As exemplified in FIG. 11, the operator 13 then adds the differences from the logical values to the measurement results, thereby obtaining an error vector. The thus obtained error vector is stored in the memory 15 (processing 1031).

After that, when a normal distortion compensation operation is performed, the VATT control unit 16 sets the attenuation amount of the variable attenuator 35 to 30 [dB], and makes the RF switch 27 into a state of ON (processings 1032 and 1033). Further, the VATT control unit 16 gives the multiplier 17 a coefficient for increasing (for example, 1000 times) the output signal level of the ADC 33 in accordance with the above mentioned attenuation amount.

Figure 6:
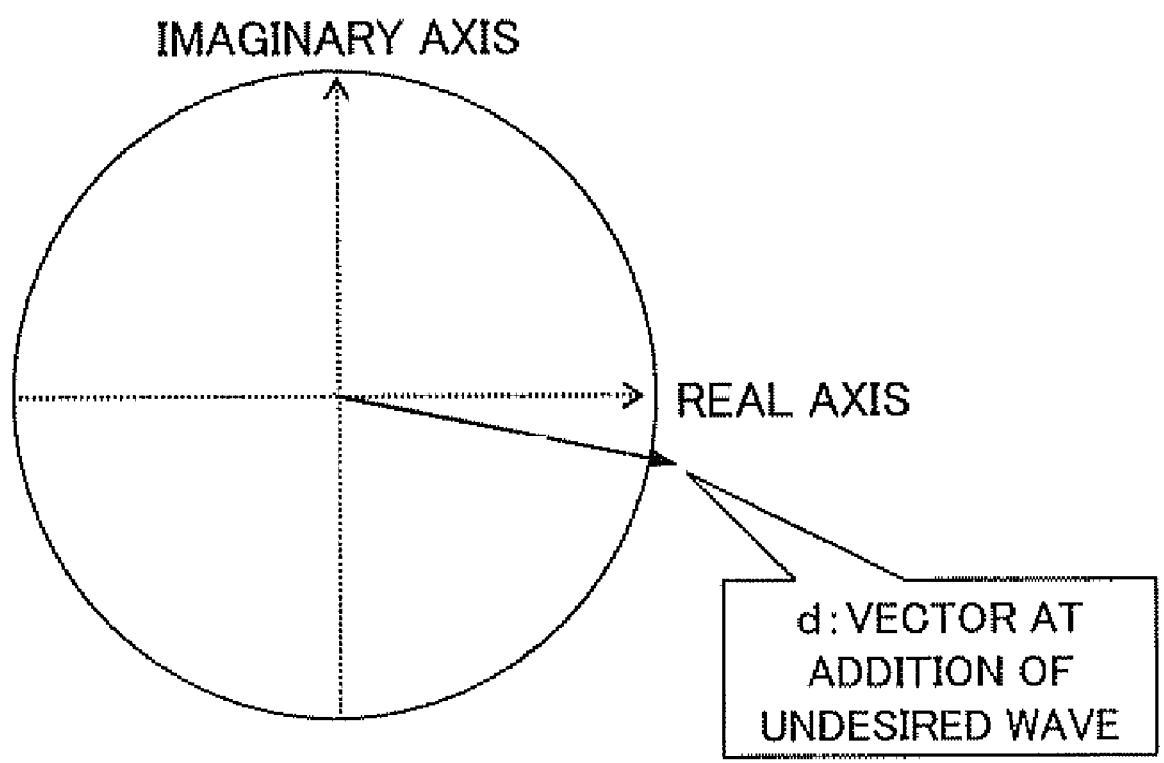

With this arrangement, the multiplier 17 increases the FB signal (for example, the vector at the time of undesired wave addition exemplified in, for example, FIG. 6) to which the above mentioned undesired wave, which is an output signal of the ADC 33, 1000 times, there by adjusting the above FB signal to the level previous to being attenuated by the variable attenuator 35 (processings 1034 and 1035).

The operator 13 subtracts the above mentioned error vector stored in the memory 15 from the vector at the time of addition of the undesired wave, thereby obtaining an error correction vector e (for example, see FIG. 4) (processing 1036). The operator 13 then corrects the vector d at the time of addition of the undesired wave based on the thus obtained error compensation vector e, thereby obtaining the ANT end signal vector c (for example, see FIG. 4) (processing 1037).

On the other hand, the comparator 14 compares the reference signal (transmission BB signal) with the ANT end signal vector c, thereby obtaining a difference signal (processing 1038). This difference signal is held in the memory 15 as an error signal generated as a result of the amplification distortion caused by the high-power amplifier 29 (FET 24) (processing 1039).

Then, the operator 13 determines the thus obtained ANT end signal vector c in such a manner that it agrees with the reference vector 1+j0 (processing 1040), and stores (reflects) the thus determined distortion compensation coefficient in the LUT 12 (processing 1041).

As described above, according to the present example, since the input signal level to the ADC 33 is increased by reducing the attenuation amount of the variable attenuator 35 at the time of measuring (training) the undesired wave (at the time the RF switch 27 is in a state of OFF), it is possible to suppress generation of a measurement error due to the noise floor of the ADC 33. Further, it is also possible to correct beforehand the dispersion (level variable errors) of the amplitude, phase, and delay amount, of the variable attenuator 35 at the time the attenuation amount of the variable attenuator 35 is changed. Accordingly, in addition to realizing the effects and benefits equivalent to those given by the embodiment and the second embodiment already described, it is possible to further improve the distortion compensation ability.

[4] Fourth Embodiment

Figure 12:
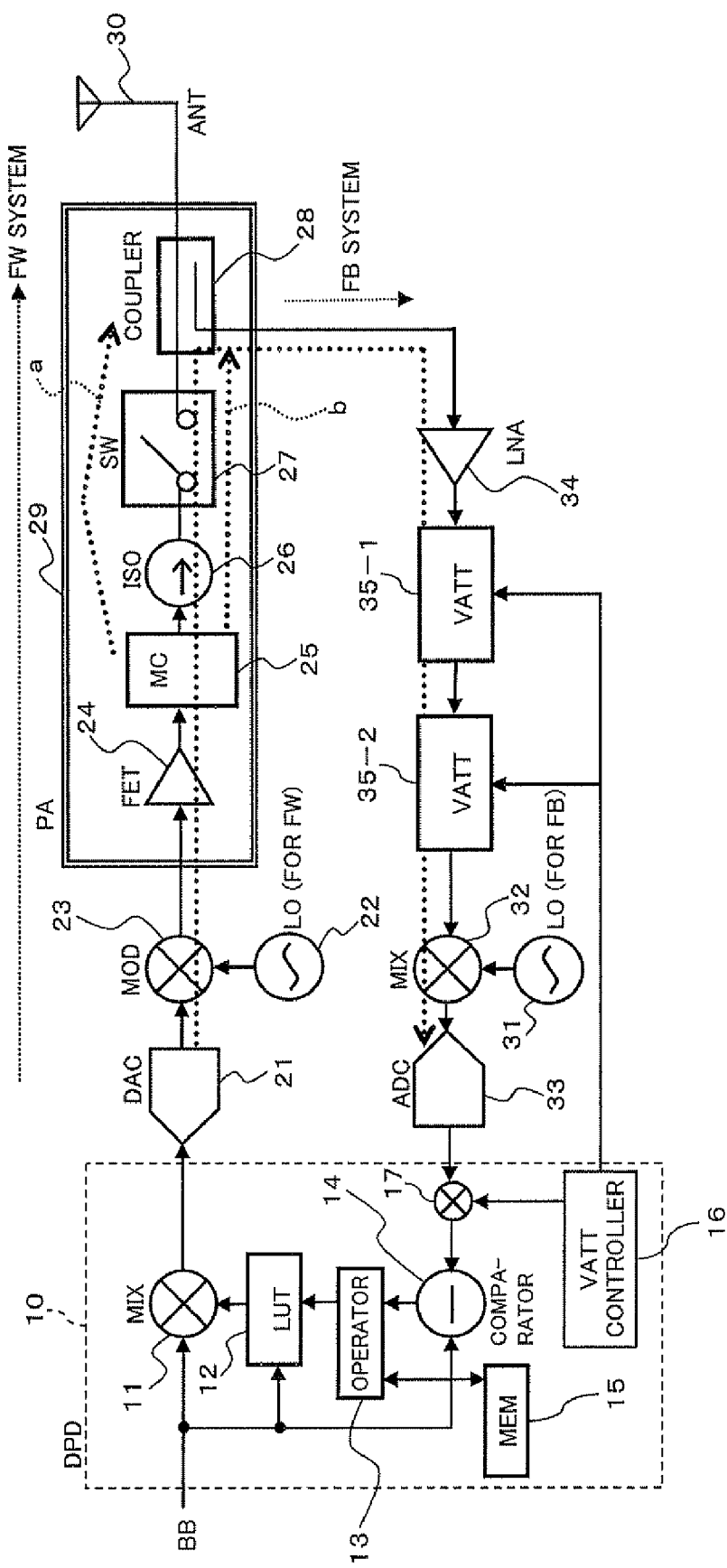
FIG. 12 is a block diagram illustrating a fourth embodiment of the transmission unit exemplified in FIG. 1.

FIG. 12 is a block diagram illustrating the construction having a DPD circuit relating to a fourth embodiment of one preferred embodiment. The transmission unit illustrated in FIG. 12 corresponds to a construction having a variable attenuation unit with a variable width of attenuation amount equivalent to the variable attenuator 35, which construction is realized by use of more than one (for example, two) variable attenuators 35-1 and 35-2 in the construction exemplified in the third embodiment (FIG. 9).

That is, in a case where there is a possibility that a measurement error is generated due to the noise floor of the ADC 33 if the FB signal level is varied with a width of 30 [dB] as already described, the variable width of the attenuation amount is divided in a variable range in which a measurement error due to the floor noise of the ADC 33 does not occur (or can be ignored). The attenuation amounts of the individual variable attenuators 35-1 and 35-2 are controlled by the VATT control unit 16.

In this instance, in FIG. 12, the elements added thereto with reference characters the same as those already described indicate the elements the same as or similar to those already described unless otherwise described.

For example, it is assumed that the variation logical values of the sum of the attenuation amounts, at the time the attenuation amounts of the variable attenuators 35-1 and 35-2 are increased, are as follows: the amplitude is 30.0 [dB]; the phase is 0 [deg]; and the delay amount is 0 [nsec]. Further, it is assumed that the error measurement results at the time only the attenuation amount of the variable attenuator 35-1 is increased are as follows: the amplitude is 15.2 [dB]; the phase is 0.3 [deg]; the delay amount is 0.2 [nsec], and also that the error measurement results at the time only the attenuation amount of the variable attenuator 35-2 is increased are as follows: the amplitude is 15.3 [dB]; the phase is 0.4 [dB]; and the delay amount is 0.3 [nsec].

In this case, as the sum of errors, the amplitude error is 30.0 [dB]−(15.2+15.3) [dB]=−0.5 [dB]; the phase error is 0 [deg]−(0.3+0.4) [deg]=−0.7 [deg]; the delay error is 0 [nsec]−(0.2+0.3) [nsec]=−0.5 [nsec].

This error difference is corrected at the time of a distortion compensation operation, so that the measurement error due to the floor noise of the ADC 33 is capable of being eliminated, and so that an error (level variable error) of the variable attenuators 35-1 and 35-2, which can occur at the time of attenuation amount change, can be removed.

That is, the transmission unit of the present example described above is provided with multiple variable attenuators 35-1 and 35-2 whose variable attenuation widths in total become a predetermined attenuation width (for example, 30 [dB]) as an example of a variable attenuation unit, and an error at the time of attenuation amount variation is measured for each of the variable attenuators 35-1 an 35-2. Then, at the time of a normal distortion compensation operation (at the time the RF switch 27 is in a state of ON), the error signal of the FB signal due to the undesired wave measured under a state where the RF switch 27 is in a state of OFF and the sum of the errors at the time of the above mentioned attenuation amount is varied, are corrected, respectively, the distortion compensation being thereby corrected.

Figure 13:
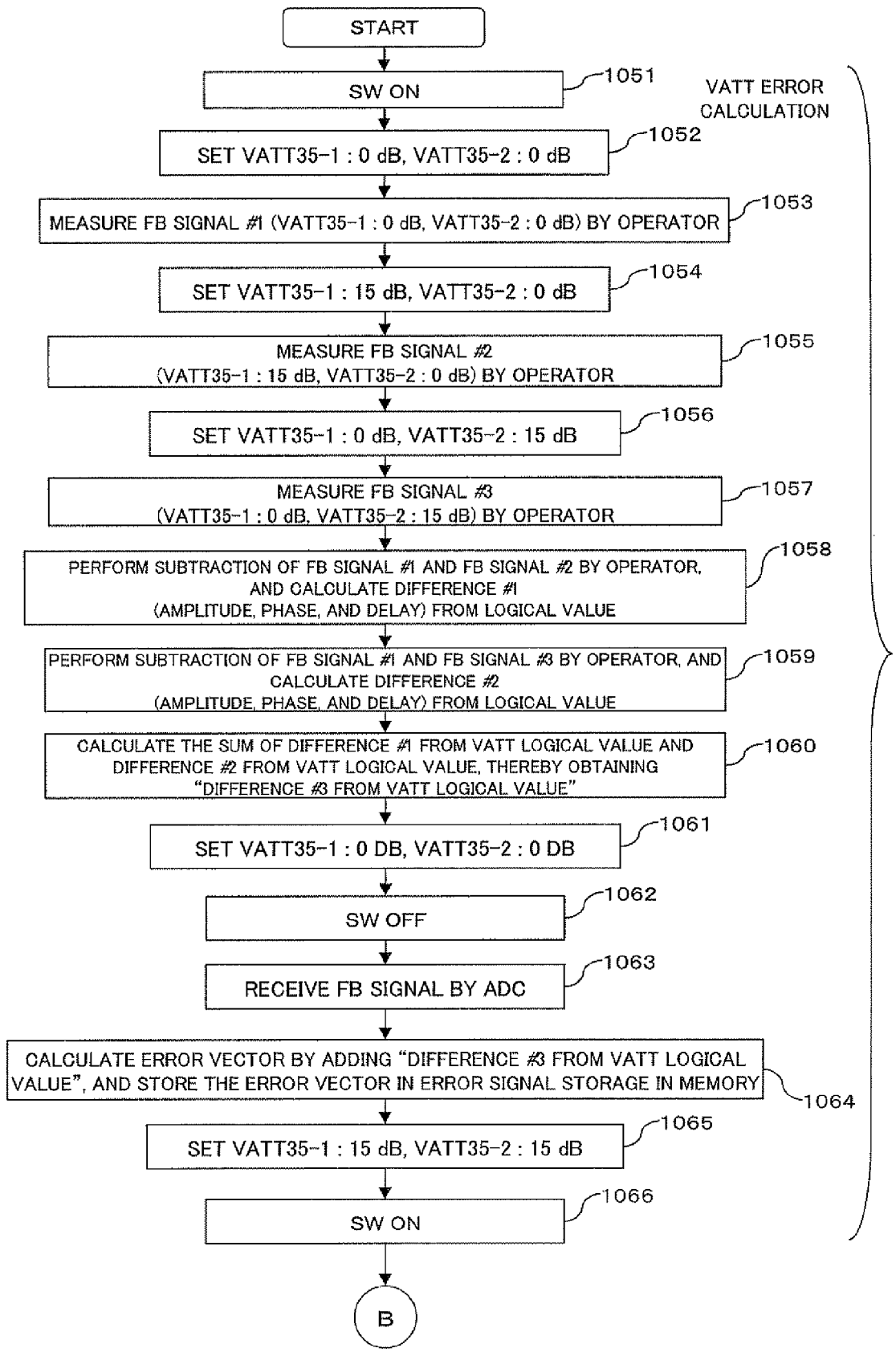
FIG. 13 is a flowchart for describing a distortion compensation operation performed by the transmission unit exemplified in FIG. 12.
Figure 14:
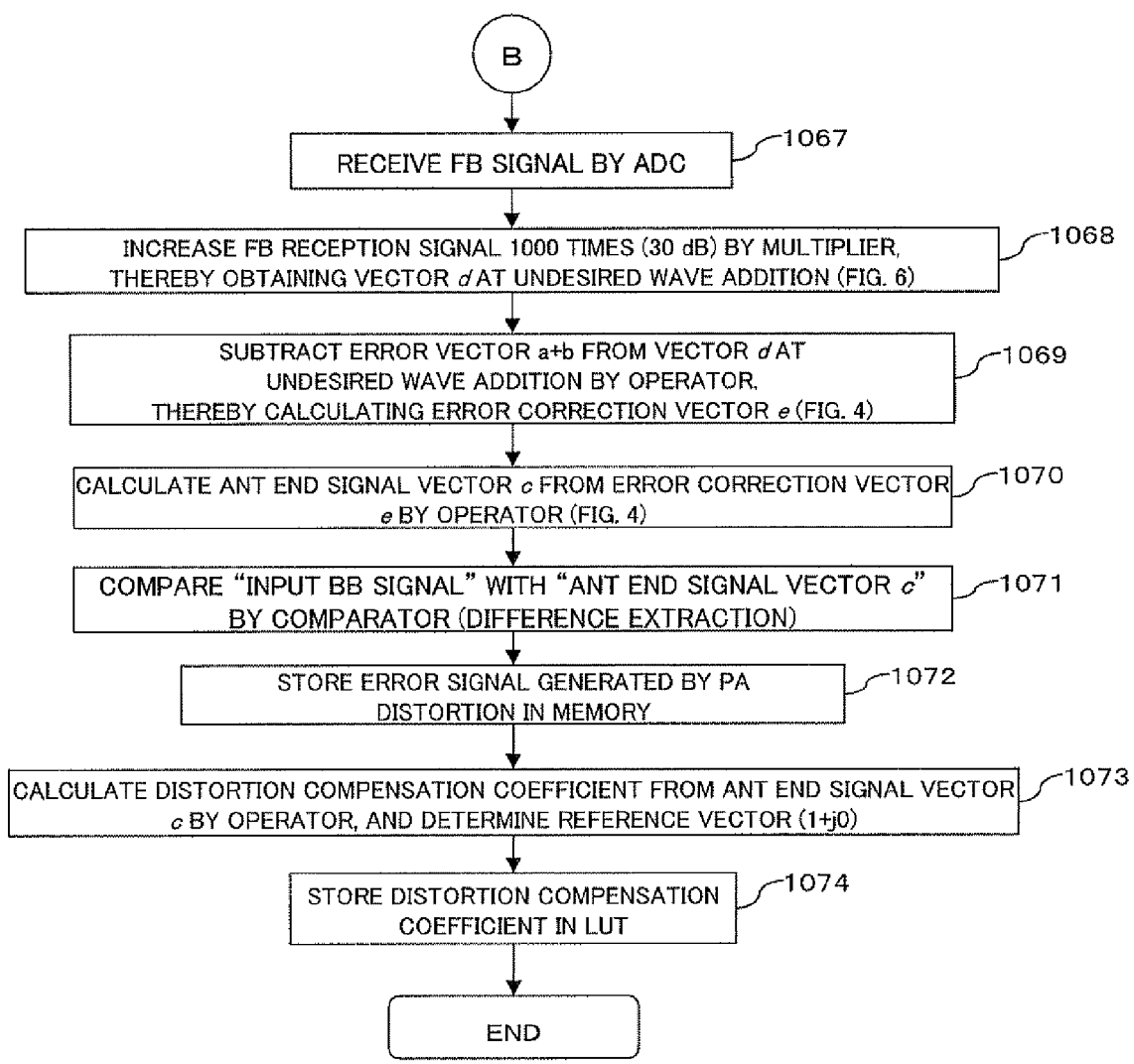
FIG. 14 is a flowchart for describing a distortion compensation operation performed by the transmission unit exemplified in FIG. 12.

Referring to FIG. 13 and FIG. 14 in combination, a detailed description will be made hereinafter of an example of a detailed operation.

First of all, as exemplified in FIG. 13, the RF switch 27 is made to be in a state of ON (processing 1051) for correcting an error due to individual dispersion of the variable attenuators 35-1 and 35-2. Together with that, the VATT control unit 16 sets the attenuation amounts of the variable attenuators 35-1 and 35-2 to 0 [dB] (processing 1052). Under this state, the operator 13 receives an FB signal #1, which is an output signal of the mixer 32 converted into a digital signal by the ADC 33, by way of the comparator 14. The operator 13 measures the amplitude, phase, and delay amount, of the FB signal #1 (processing 1053).

Subsequently, the VATT control unit 16 sets the attenuation amount of the variable attenuator 35-1 to 15 [dB], and the attenuation amount of the variable attenuator 35-2, to 0 [dB] (processing 1054). Under such a state, the amplitude, phase, and delay amount, of the FB signal #2 inputted from the comparator 14 by way of the ADC 33 is measured (processing 1055).

Further, the VATT control unit 16 sets the attenuation amount of the variable attenuator 35-1 to 0 [dB], and the attenuation amount of the variable attenuator 35-2, to 15 [dB] (processing 1056). Under that state, the amplitude, phase, delay amount of the FB signal #3 input from the comparator 14 by way of the ADC 33 are measured (processing 1057).

The operator 13 then obtains a difference #1 to the logical values of the amplitudes, phase, delay amount, of the measured FB signal #1 and FB signal #2 and a difference #2 to the logical values of the amplitude, phase, delay amount of the measured FB signal #1 and FB signal #3 (processing 1058 and processing 1059).

Further, the operator 13 sums up the obtained differences #1 and #2, thereby obtaining a difference #3 (processing 1060). The thus obtained difference is stored in, for example, the memory 15.

Subsequently, to perform measurement (training) of the undesired wave coupled to the FB signal path, the VATT control unit 16 sets each of the attenuation amounts of the variable attenuators 35-1 and 35-2 to 0 [dB] (processing 1061). Further, the RF switch 27 is made to be in a state of OFF (processing 1062).

Under this state, the operator 13 measures the amplitude, phase, and delay amount, of the FB signal (undesired wave) of the FB signal input from the comparator 14 by way of the ADC 33 (processing 1063), and adds a difference #3 to the measurement result with respect to the above mentioned logical value, thereby obtaining an error vector. The thus obtained error vector is stored in the memory 15 (processing 1064).

After that, at the time a normal distortion compensation operation is performed, the VATT control unit 16 sets each of the attenuation amounts of the variable attenuators 35-1 and 35-2 to 15 [dB], together with making the RF switch 27 in a state of ON (processings 1065 and 1066). Further, the VATT control unit 16 gives the multiplier 17 a coefficient for increasing the output signal level of the ADC 33 (for example, 1000 times) in accordance with the attenuation amount.

With this arrangement, as exemplified in FIG. 14, the FB signal to which the undesired wave, which is the output signal of the ADC 33 (for example, a vector at the time of addition of the undesired wave exemplified in, for example, FIG. 6) is coupled, is increased 1000 times by the multiplier 17, and is then adjusted to the level before being attenuated by the variable attenuator 35 (processings 1067 and 1068).

The operator 13 subtracts the above mentioned error vector stored in the memory 15 from the above mentioned vector at the time of addition of the undesired wave, thereby obtaining an error correction vector e (for example, see FIG. 4) (processing 1069). The operator 13 then corrects a vector d at the time of addition of an undesired wave based on the thus obtained error correction vector e, thereby obtaining the ANT end signal vector c (see FIG. 4, for example) (processing 1070).

On the other hand, the comparator 14 compares the reference signal (transmission BB signal) with the ANT end signal vector c, thereby obtaining a difference signal (processing 1071). This difference signal is held in the memory 15 as an error signal generated as a result of the amplification distortion caused by the high-power amplifier 29 (FET 24) (processing 1072).

Then, the operator 13 determines a distortion compensation coefficient in such a manner that the ANT end signal vector c obtained as described above agrees with the reference vector 1+j0 (processing 1073), and the thus determined distortion compensation coefficient is stored (reflected) in the LUT 12 (processing 1074).

In this manner, according to the present example, since the level variable amount of the FB signal is made to be shared by the multiple variable attenuators 35-1 and 35-2, it is possible to decrease the variable width of the attenuation amount of the individual variable attenuators 35-1 and 35-2. Accordingly, at the time of measuring an error signal of the FB signal due to an undesired wave (at the time the RF switch 27 is in a state of OFF), it becomes possible to vary (increase) the level of the FB signal within a range in which any effect of the noise floor of the ADC 33 is absent (or can be ignored).

Further, an error which can be generated in the FB signal at the time the attenuation amount varies is measured beforehand for the variable attenuators 35-1 and 35-2. Then, at the time of a normal distortion compensation operation (at the time the RF switch 27 is in a state of ON), the sum of an error signal of the FB signal due to the undesired wave measured with the RF switch 27 being in a state of OFF and an error at the time the above attenuation amount is variable, are corrected, distortion compensation being thereby performed.

Accordingly, in addition to obtaining the effects and the benefits similar to those obtained in the third embodiment already described, it is possible to further improve the distortion compensation ability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) has(have) been described in detail, it should be understood that the various changes, substitutions, and alterations could be made hereto without departing from the spirit and scope of the invention.

What is claimed is:

1. A distortion compensation apparatus, comprising:
a distortion compensating unit to perform compensation of distortion caused in an amplifier in response to a result of comparison between an input signal to the amplifier and an output signal from the amplifier;
a branching unit to branch a part of the output signal to a signal path to the distortion compensating unit;
a switch to interrupt or pass the output signal inputted to the branching unit; and
a controlling unit to control an amount of the compensation of the distortion under a pass-permitted state in which the switch passes the output signal in response to a result of measurement of a signal transmitted to the distortion compensating unit through the signal path under an interruption state in which the switch interrupts the output signal.

2. The distortion compensation apparatus as set forth in claim 1, wherein an isolator, which prevents propagation of a reflection signal to the amplifier, is provided between the amplifier and the switch.

3. The distortion compensation apparatus as set forth in claim 1, wherein a low-noise amplifier is provided for the signal path.

4. The distortion compensation apparatus as set forth in claim 2, wherein a low-noise amplifier is provided for the signal path.

5. The distortion compensation apparatus as set forth in claim 1,
wherein a variable attenuation unit, which is capable of changing a level of the signal with a predetermined attenuation width in response to the pass-permitted state and the interruption state of the switch, is provided for the signal pass and
wherein the controlling unit measures beforehand an error which can be generated in the signal, accompanying variations in the level, and corrects the amount according to a result of the measurement.

6. The distortion compensation apparatus as set forth in claim 5,
wherein the variable attenuation unit has a plurality of variable attenuators whose variable attenuation widths become the attenuation width in total and
wherein the controlling unit performs the error measurement to each of the variable attenuators, and corrects the amount according to the sum of the measured errors.

7. A distortion compensation method for use in an apparatus including: a distortion compensating unit to perform compensation of distortion caused in an amplifier in response to a result of comparison between an input signal to the amplifier and an output signal from the amplifier; and a branching unit to branch a part of the output signal to a signal path to the distortion compensating unit, the distortion compensation method comprising:
measuring a signal transmitted to the distortion compensating unit through the signal path under an interruption state in which the output signal passes to the branching unit; and
controlling an amount of the compensation of the distortion under a pass-permitted state in which the output signal is made to pass to the branching unit, in response to the result of the measurement.

8. The distortion compensation method as set forth in claim 7,
wherein a variable attenuation unit, which is capable of changing a level of the signal with a predetermined attenuation width in response to the pass-permitted state and the interruption state, is provided for the signal pass, and
wherein the controlling includes measuring beforehand an error which can be generated in the signal, accompanying variations in the level, and correcting the amount according to a result of the measurement.

9. The distortion compensation method as set forth in claim 8,
wherein the variable attenuation unit has a plurality of variable attenuators whose variable attenuation widths become the attenuation width in total, and
wherein the controlling includes performing the error measurement to each of the variable attenuators, and correcting the amount according to the sum of the measured errors.

* * * * *